US010923636B2

(12) United States Patent
Lee et al.

(10) Patent No.: US 10,923,636 B2
(45) Date of Patent: Feb. 16, 2021

(54) WAVELENGTH CONVERTING PARTICLE, METHOD FOR MANUFACTURING WAVELENGTH CONVERTING PARTICLE, AND LIGHT-EMITTING DIODE CONTAINING WAVELENGTH CONVERTING PARTICLE

(71) Applicant: POSTECH ACADEMY-INDUSTRY FOUNDATION, Pohang-si (KR)

(72) Inventors: Tae-woo Lee, Pohang-si (KR); Younghoon Kim, Daejeon (KR); Himchan Cho, Daegu (KR)

(73) Assignee: POSTECH ACADEMY-INDUSTRY FOUNDATION

( * ) Notice: Subject to any disclaimer, the term of this patent is extended or adjusted under 35 U.S.C. 154(b) by 0 days.

(21) Appl. No.: 16/578,264

(22) Filed: Sep. 20, 2019

(65) Prior Publication Data

US 2020/0020834 A1   Jan. 16, 2020

Related U.S. Application Data

(62) Division of application No. 15/524,761, filed as application No. PCT/KR2015/011957 on Nov. 6, 2015, now Pat. No. 10,424,696.

(30) Foreign Application Priority Data

Nov. 6, 2014  (KR) .................. 10-2014-0153967

(51) Int. Cl.
*H01L 33/50* (2010.01)
*C09K 11/06* (2006.01)
(Continued)

(52) U.S. Cl.
CPC .......... *H01L 33/504* (2013.01); *C09K 11/025* (2013.01); *C09K 11/06* (2013.01);
(Continued)

(58) Field of Classification Search
CPC ... H01L 33/504; H01L 33/502; H01L 33/505; H01L 33/507; H01L 51/0077;
(Continued)

(56) References Cited

U.S. PATENT DOCUMENTS

2008/0014463 A1* 1/2008 Varadarajan et al. .....................
  C09K 11/693
  428/690
2010/0051898 A1  3/2010 Kim et al.

FOREIGN PATENT DOCUMENTS

| KR | 20100027892 A | 3/2010 |
| KR | 20140003998 A | 1/2014 |
| KR | 20140007045 A | 1/2014 |

OTHER PUBLICATIONS

KIPO, International Search Report of Application No. of PCT/KR2015/011957, dated Mar. 25, 2016.
(Continued)

*Primary Examiner* — Thinh T Nguyen
(74) *Attorney, Agent, or Firm* — Renaissance IP Law Group LLP

(57) ABSTRACT

Provided are a wavelength converting particle, a method for manufacturing a wavelength converting particle, and a light-emitting diode containing a wavelength converting particle. The wavelength converting particle comprises a hybrid OIP nanocrystal that converts a wavelength of light generated by an excitation light source into a specified wavelength. Accordingly, it is possible to optically stabilize and improve color purity and light-emission performance without changes in a light-emitting wavelength range.

9 Claims, 9 Drawing Sheets

(51) Int. Cl.
    *C09K 11/02* (2006.01)
    *G02F 1/355* (2006.01)
    *G02F 1/377* (2006.01)

(52) U.S. Cl.
    CPC .......... *G02F 1/3551* (2013.01); *G02F 1/3775* (2013.01); *H01L 33/502* (2013.01); *H01L 33/505* (2013.01); *C09K 2211/188* (2013.01); *H01L 33/507* (2013.01)

(58) Field of Classification Search
    CPC ..... H01L 51/0026; H01L 51/56; C09K 11/06; C09K 11/025; G02F 1/3551; G02F 1/3775
    USPC .................. 257/9, 15, 98; 438/22, 25, 29
    See application file for complete search history.

(56) References Cited

OTHER PUBLICATIONS

Lim, K.-G. et al., "Boosting the Power Conversion Efficiency of Perovskite Solar Cells Using Self-Organized Polymeric Hole Extraction Layers with High Work Function" Advanced Materials. 2014, vol. 26, No. 37, pp. 6461-6466, Aug. 14, 2014.
Schmidt, L. C. et al, "Nontemplate Synthesis of CH3NH3PbBr3 Perovskite Nanoparticles" Journal of the American Chemical Society, 2014, vol. 136. No. 3, pp. 850-853, Jan. 3, 2014.

\* cited by examiner

US 10,923,636 B2

WAVELENGTH CONVERTING PARTICLE, METHOD FOR MANUFACTURING WAVELENGTH CONVERTING PARTICLE, AND LIGHT-EMITTING DIODE CONTAINING WAVELENGTH CONVERTING PARTICLE

TECHNICAL FIELD

The present invention relates to a wavelength converting particle, a method of manufacturing a wavelength converting particle, and a light-emitting diode (LED) containing a wavelength converting particle, and more particularly, to a wavelength converting nanoparticle containing a hybrid organic-inorganic perovskite (OIP) nanocrystal, a method of manufacturing a wavelength converting nanoparticle containing a hybrid OIP nanocrystal, and an LED containing a wavelength converting nanoparticle containing a hybrid OIP nanocrystal.

BACKGROUND ART

A light-emitting diode (LED) is a semiconductor device that converts electric current into light and is mainly used as a light source of a display device. Such an LED exhibits very excellent properties in terms of a small size, low power consumption, a long lifetime, and a fast response time when compared to conventional light sources. In addition, an LED is environment-friendly because it does not release harmful electromagnetic waves such as ultraviolet light and also does not use mercury and other discharge gases. An LED is usually formed by combining an LED light source using a wavelength converting particle such as a phosphor.

Conventionally, a quantum dot has been used as the wavelength converting particle. A quantum dot generates stronger light at a narrower wavelength band than a typical phosphor. Light emission of a quantum dot is achieved when exited electrons transition from the conduction band to the valence band. The same material has a wavelength that varies depending on its size. A quantum dot may emit light of a shorter wavelength as the quantum dot decreases in size. Accordingly, it is possible to obtain light of a desired wavelength region by adjusting the size of the quantum dot.

A quantum dot may emit light even when an excited wavelength is arbitrarily selected. Accordingly, it is possible to observer light of several colors at once by exciting several kinds of quantum dots with a single wavelength. Also, since a quantum dot only transitions from a ground vibration state of the conduction band to a ground vibration state of the valence band, a light emission wavelength is generally monochromatic light.

A quantum dot is a nanocrystal of a semiconductor material having a diameter of about 10 nm. A vapor deposition method such as metal organic chemical vapor deposition (MOCVD) or molecular beam epitaxy (MBE) or a chemical wet method in which precursors are inserted into an organic solvent to grow a crystal is used to form the quantum dot. The chemical wet method, which is a method of adjusting crystalline growth with an organic solvent naturally coordinated on a quantum dot determination surface to serve as a dispersing agent when a crystal is grown, has advantages over a vapor deposition method such as MOCVD or MBE because the chemical wet method can adjust uniformity in size and form of a nanocrystal through an easier and cheaper process.

However, a quantum dot has disadvantages in that the quantum dot is too unstable to be used as a wavelength converting material and has a limited color purity and luminescent effect. Accordingly, developing a wavelength converting material that is more stable and has improved color impurity and light emission performance is urgently required.

DETAILED DESCRIPTION OF THE INVENTION

Technical Problem

The present invention is designed to solve the above problems and is directed to providing a wavelength converting body that is optically stable and has enhanced color purity and light emission performance, a manufacturing method therefor, and a light-emitting diode (LED) containing the same.

TECHNICAL SOLUTION

One aspect of the present invention provides a wavelength converting nanoparticle. The wavelength converting nanoparticle includes a hybrid organic-inorganic perovskite (OIP) nanocrystal that converts a wavelength of light generated by an excitation light source into a specified wavelength.

The hybrid OIP nanocrystal may include a hybrid OIP nanocrystal characterized by being capable of being dispersed in an organic solvent, may have a size ranging from 1 nm to 900 nm, and may have band gap energy ranging from 1 eV to 5 eV.

The hybrid OIP wavelength converting nanoparticle may further include a plurality of organic ligands that surround the hybrid OIP nanocrystal. The organic ligands may include alkyl halides.

The hybrid OIP may include a structure of $A_2BX_4$, $ABX_4$, $ABX_3$, or $A_{n-1}B_nX_{3n+1}$ (n is an integer ranging from 2 to 6). Here, A may be organic ammonium, B may be a metallic material, and X may be a halogen element. A may be $(CH_3NH_3)_n$, $((C_xH2_{x+1})_nNH_3)_2(CH_3NH_3)_n$, $(RNH_3)_2$, $(C_nH_{2n+1}NH_3)_2$, $(CF_3NH_3)$, $(CF_3NH_3)_n$, $((C_xF_{2x+1})_nNH_3)_2$ $(CF_3NH_3)_n$, $((C_xF_{2x+1})_nNH_3)_2$, or $(C_nF_{2n+1}NH_3)_2$ (n is an integer greater than or equal to 1 and x is an integer greater than or equal to 1), B may be a divalent transition metal, a rare earth metal, an alkaline earth metal, Pb, Sn, Ge, Ga, In, Al, Sb, Bi, Po, or a combination thereof, and X may be Cl, Br, I, or a combination thereof.

Another aspect of the present invention provides a manufacturing method for a wavelength converting nanoparticle. The manufacturing method includes preparing a first solution, which has a hybrid OIP dissolved in a protic solvent, and a second solution, which has an alkyl halide surfactant dissolved in an aprotic solvent; and forming a nanoparticle by mixing the first solution with the second solution. Here, the wavelength converting nanoparticle includes a hybrid OIP nanocrystal that converts a wavelength of light generated by an excitation light source into a specified wavelength.

The forming of a nanoparticle by mixing the first solution with the second solution may include adding the first solution to the second solution in drops. The hybrid OIP may include a structure of $A_2BX_4$, $ABX_4$, $ABX_3$, or $A_{n-1}B_nX_{3n+1}$ (n is an integer ranging from 2 to 6). Here, A may be organic ammonium, B may be a metallic material, and X may be a halogen element. A may be $((CH_3NH_3)_n$, $((C_xH2_{x+1})_nNH_2)$ $(CH_3NH_3)_n$, R $(NH_3)_2$, $(C_nH_{2n+1}NH_3)_2$, $(CF_3NH_3)$, $(CF_3NH_3)''$, $((C_xF_{2x+1})_nNH_2)(CF_3NH_3)_n$, $((C_xF_{2x+1})_nNH_3)_2$, or $(C_nF_{2n+1}NH_3)_2$ (n is an integer greater than or equal to 1 and x is an integer greater than or equal to 1), R may be an Alkyl, B may be a divalent transition metal, a rare earth metal, an alkaline earth metal, Pb, Sn, Ge, Ga, In, Al, Sb, Bi, Po, or a combination thereof, and X may be Cl, Br, I, or a combination thereof.

Another aspect of the present invention provides a hybrid OIP nano wavelength converting layer. The wavelength converting layer includes the above-described wavelength converting nanoparticle.

Another aspect of the present invention provides a nano wavelength converting body. The nano wavelength converting body includes the above-described wavelength converting nanoparticle; a dispersion medium configured to disperse the wavelength converting nanoparticle; and a sealing member configured to seal the wavelength converting nanoparticle and the dispersion medium, wherein the wavelength converting particle is dispersed in the dispersion medium. The dispersion medium may be in a liquid state.

Still another aspect of the present invention provides a light-emitting device. The light-emitting device includes a base structure; at least one excitation light source disposed on the base structure and configured to emit light of a predetermined wavelength; and a wavelength converting layer disposed along an optical path of the excitation light source and including the above-described wavelength converting nanoparticle. The wavelength converting layer may include a hybrid OIP nano wavelength converting body including the wavelength converting nanoparticle; a dispersion medium configured to disperse the wavelength converting nanoparticle; and a sealing member configured to seal the wavelength converting nanoparticle and the dispersion medium, wherein the wavelength converting particle is dispersed in the dispersion medium.

Advantageous Effects of the Invention

According to the present invention, it is possible to implement a wavelength converting particle that is optically stable and has enhanced color purity and light emission performance without changes in a light-emitting wavelength band thereof due to a particle size because the wavelength converting particle contains a hybrid organic-inorganic perovskite nanocrystal.

MODE OF THE INVENTION

Figure 1:
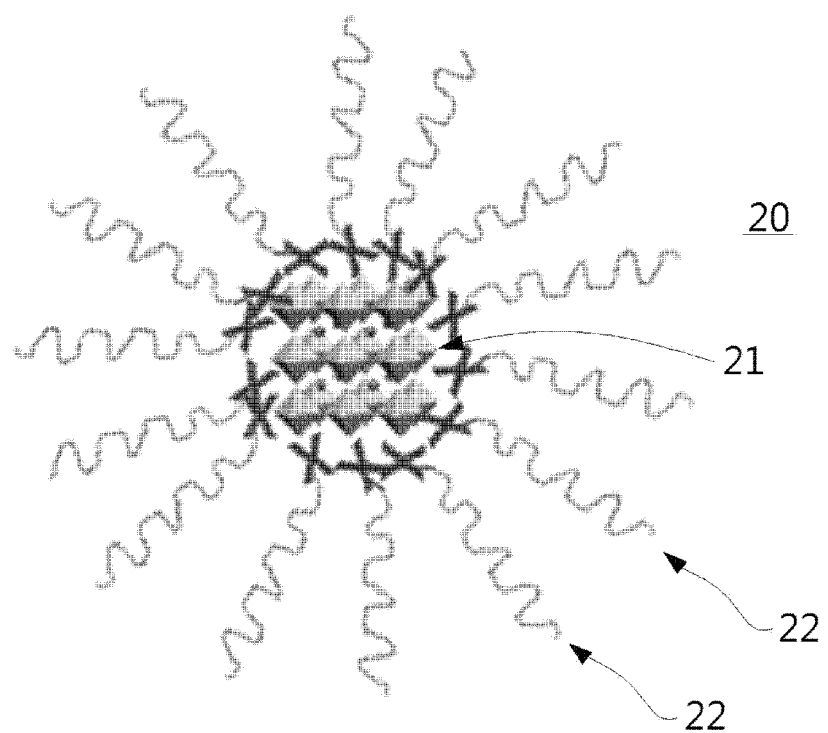
FIG. 1 is a schematic diagram showing a wavelength converting nanoparticle containing a hybrid OIP nanocrystal according to an embodiment of the present invention.

Hereinafter, preferred embodiments of the present invention will be described in detail with reference to the accompanying drawings to describe the present invention. The present invention may, however, be embodied in different forms and should not be construed as limited to the embodiments set forth herein. Like reference numerals refer to like elements throughout the specification.

<Wavelength Converting Particle>

A wavelength converting nanoparticle containing a hybrid OIP nanocrystal that converts a wavelength of light generated by an excitation light source into a specified wavelength according to an embodiment of the present invention will be described below.

When light incident from the outside (incident light) reaches the above-described hybrid OIP wavelength converting particle, the wavelength converting particle emits light converted in wavelength. Accordingly, a wavelength converting body functions to covert a wavelength of light through the hybrid OIP wavelength converting particle. Hereinafter, a portion of the incident light having a wavelength shorter than that of light emitted by the above-described hybrid OIP wavelength converting particle is referred to as excitation light. Also, a light source that emits the above-described excitation light is referred to as an excitation light source.

FIG. 1 is a schematic diagram showing a wavelength converting nanoparticle containing a hybrid OIP nanocrystal according to an embodiment of the present invention.

Referring to FIG. 1, a wavelength converting particle according to an embodiment of the present invention, which is a hybrid OIP nanoparticle, includes a hybrid OIP nanocrystal 21 having a lamellar structure composed of alternating organic and inorganic surfaces.

The nanocrystal may have a band gap adjustable by halogen element substitution. The nanocrystal may have band gap energy ranging from 1 eV to 5 eV.

For example, the band gap may be adjusted by organic element substitution or center metal substitution.

Such a hybrid OIP may include a structure of $A_2BX_4$, $ABX_4$, $ABX_3$, or $A_{n-1}B_nX_{3n+1}$ (n is an integer ranging from 2 to 6). Here, A is an organic ammonium material, B is a metallic material, and X is a halogen element. For example, A may be $(CH_3NH_3)_n$, $((C_xH_{2x+1})_nNH_3)_2(CH_3NH_3)_n$, $(RNH_3)_2$, $(C_nH_{2n+1}NH_3)_2$, $(CF_3NH_3)$, $(CF_3NH_3)_n$, $((C_xF_{2x+1})_nNH_3)_2(CF_3NH_3)_n$, $((C_xF_{2x+1})_nNH_3)_2$, or $(C_nF_{2n+1}NH_3)_2$ (n is an integer greater than or equal to 1 and x is an integer greater than or equal to 1). B may be a divalent transition metal, a rare earth metal, an alkaline earth metal, Pb, Sn, Ge, Ga, In, Al, Sb, Bi, Po, or a combination thereof. In this case, the divalent transition metal may be, for example, Ge, Sn, Pb, Eu, or Yb. Also, the alkaline earth metal may be, for example, Ca or Sr. Also, X may be Cl, Br, I, or a combination thereof.

A wavelength converting nanoparticle 20 containing a hybrid OIP nanocrystal according to the present invention may additionally contain a plurality of organic ligands 22 surrounding the hybrid OIP nanocrystal 21. In this case, the organic ligands 22, which are used as a surfactant, may include alkyl halides. Accordingly, the alkyl halides used as the surfactant to stabilize a surface of such a hybrid OIP separated in the above-described manner become the organic ligands surrounding a surface of the hybrid OIP nanocrystal.

When an alkyl halide surfactant has a short length, a nanocrystal formed therewith has a large size and may have a size greater than 900 nm. In this case, there may be a fundamental problem in that excitons are separated as free charges and disappear, instead of being used to emit light, due to thermal ionization and charge carrier delocalization in a large nanocrystal.

That is, the size of the hybrid OIP nanocrystal is inversely proportional to the length of the alkyl halide surfactant used to form the nanocrystal.

Accordingly, it is possible to adjust the size of the hybrid OIP nanocrystal to a certain size or smaller by using alkyl halides of a certain size or larger as the surfactant. For example, a hybrid OIP nanocrystal having a size ranging from 1 nm to 900 nm may be formed by using octadecyl ammonium bromide as the alkyl halide surfactant.

Figure 2:
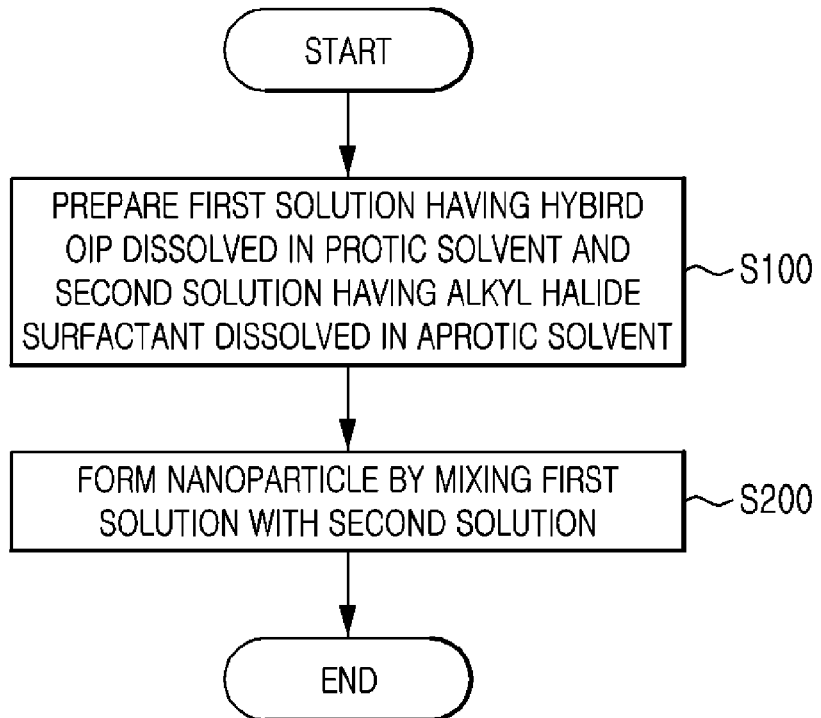
FIG. 2 is a flowchart showing a manufacturing method for a wavelength converting nanoparticle containing a hybrid OIP nanocrystal according to an embodiment of the present invention.

FIG. 2 is a flowchart showing a manufacturing method for a wavelength converting nanoparticle containing a hybrid OIP nanocrystal according to an embodiment of the present invention.

Referring to FIG. 2, the manufacturing method for a wavelength converting nanoparticle containing a hybrid OIP nanocrystal may include preparing a first solution having a hybrid OIP dissolved in a protic solvent and a second solution having an alkyl halide surfactant dissolved in an aprotic solvent (S100) and forming a nanoparticle by mixing the first solution with the second solution (S200).

That is, the wavelength converting nanoparticle containing the hybrid OIP nanocrystal according to an embodiment of the present invention may be manufactured through an inverse nano-emulsion method.

In detail, first, the first solution having the hybrid OIP dissolved in the protic solvent and the second solution having the alkyl halide surfactant dissolved in the aprotic solvent are prepared (S100).

In this case, the protic solvent may include, but is not limited to, dimethylformamide, gamma butyrolactone, N-methylpyrrolidone, or dimethylsulfoxide.

Also, the hybrid OIP may be a material having a crystalline structure. For example, the hybrid OIP may have a structure of $A_2BX_4$, $ABX_4$, $ABX_3$, or $A_{n-1}B_nX_{3n+1}$ (n is an integer ranging from 2 to 6).

Here, A is an organic ammonium material, B is a metallic material, and X is a halogen element.

For example, A may be $(CH_3NH_3)_n$, $((C_xH_{2x+1})_nNH_3)_2(CH_3NH_3)_n$,$(RNH_3)_2$, $(C_nH_{2n+1}NH_3)_2$, $(CF_3NH_3)$, $(CF_3NH_3)_n$, $((C_xF_{2x+1})_nNH_3)_2(CF_3NH_3)_n$, $((C_xF_{2x+1})_nNH_3)_2$, or $(C_nF_{2n+1}NH_3)_2$ (n is an integer greater than or equal to 1 and x is an integer greater than or equal to 1). Also, B may be a divalent transition metal, a rare earth metal, an alkaline earth metal, Pb, Sn, Ge, Ga, In, Al, Sb, Bi, Po, or a combination thereof. In this case, the divalent transition metal may be, for example, Ge, Sn, Pb, Eu, or Yb. Also, the alkaline earth metal may be, for example, Ca or Sr. Also, X may be Cl, Br, I, or a combination thereof.

Figure 3:
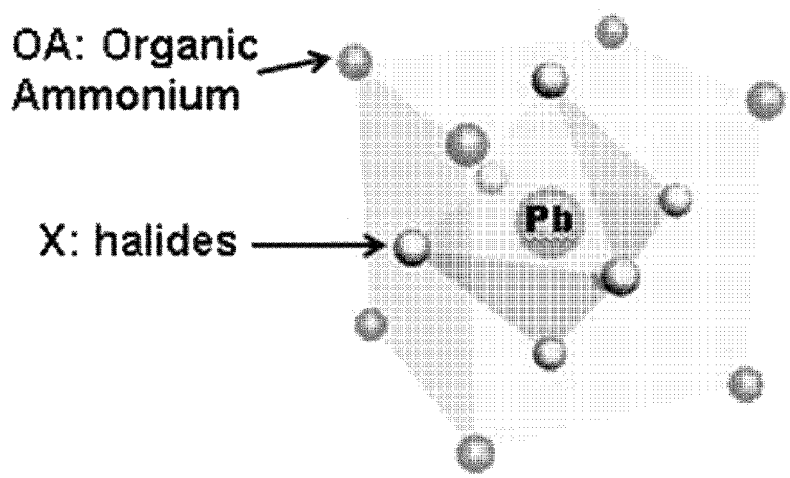
FIG. 3 is a schematic diagram of a perovskite nanocrystalline structure according to an embodiment of the present invention.

FIG. 3 is a schematic diagram of a perovskite nanocrystalline structure according to an embodiment of the present invention.

Referring to FIG. 3, it can be seen that the perovskite nanocrystalline structure according to an embodiment of the present invention includes organic ammonium and halides.

Such a perovskite may be prepared by combining AX and $BX_2$ at a certain ratio. That is, the first solution may be formed by dissolving AX and $BX_2$ in a protic solvent at a certain ratio. For example, a first solution having an $A_2BX_3$ hybrid OIP dissolved therein may be prepared by dissolving AX and $BX_2$ in the protic solvent at a ratio of 2:1.

Also, the aprotic solvent may include, but is not limited to, dichloromethane, trichlorethylene, chloroform, chlorobenzene, dichlorobenzene, styrene, dimethylformamide, dimethylsulfoxide, xylene, toluene, cyclohexene, or isopropyl alcohol.

Also, the alkyl halide surfactant may have a structure of alkyl-X. In this case, a halogen corresponding to X may include Cl, Br, or I. In this case, the structure of alkyl-X may include, but is not limited to, acyclic alkyl having a structure of $C_nH_{2n+1}$, primary alcohol, secondary alcohol, and tertiary alcohol having a structure of $C_nH_{2n+1}OH$ or the like, alkylamine having a structure of alkyl-N (e.g., hexadecyl amine or 9-Octadecenylamine 1-Amino-9-octadecene $(C_{19}H_{37}N)$), p-substituted aniline, phenyl ammonium, and fluorine ammonium.

Subsequently, a nanoparticle is formed by mixing the first solution with the second solution (S200).

The forming of a nanoparticle by mixing the first solution with the second solution preferably includes adding the first solution to the second solution in drops. In this case, the second solution may be agitated. For example, the nanoparticle may be synthesized by slowly adding the first solution having the OIP dissolved therein to the second solution having the alkyl halide surfactant dissolved therein, which is being strongly agitated, in drops.

In this case, when the first solution is mixed with the second solution drop by drop, the OIP is precipitated from the second solution because of a solubility difference therebetween. Also, the alkyl halide surfactant stabilizes a surface of the OIP precipitated from the second solution to generate a well-dispersed OIP nanocrystal (OIP-NC). Accordingly, it is possible to manufacture a wavelength converting nanoparticle containing a hybrid OIP nanocrystal that includes an OIP-NC and a plurality of alkyl halide organic ligands surrounding the OIP-NC.

Such an OIP-NC may be controlled in size by adjusting a length or shape factor of the alkyl halide surfactant. For example, the adjustment of the shape factor may be controlled through a tapered or an inversely triangular surfactant.

It is preferable that an OIP-NC generated in the above manner have a size ranging from 1 nm to 900 nm. When the OIP-NC is formed to have a size greater than 900 nm, there may be a fundamental problem in that excitons are separated as free charges and disappear, instead of being used to emit light, due to thermal ionization and charge carrier delocalization in a large nanocrystal.

Figure 4:
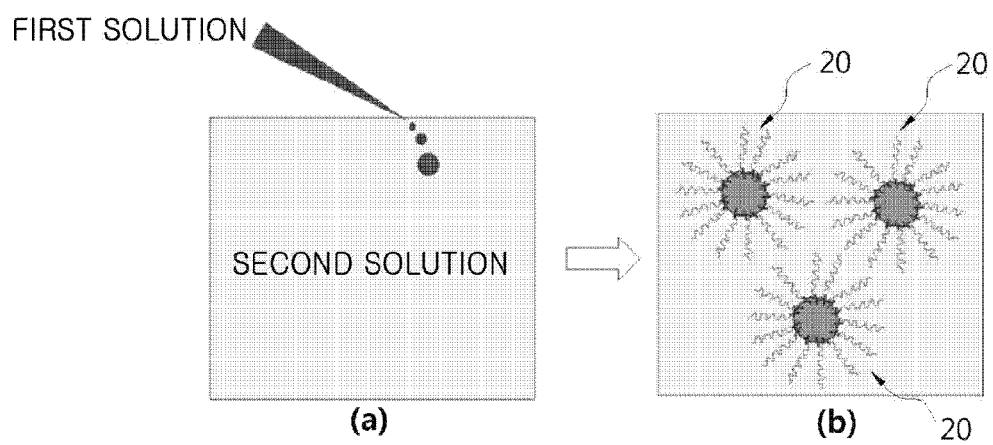
FIG. 4 is a schematic diagram showing a method of manufacturing a wavelength converting nanoparticle containing a hybrid OIP nanocrystal through an inverse nanoemulsion method according to an embodiment of the present invention.

FIG. 4 is a schematic diagram showing a method of manufacturing a wavelength converting nanoparticle containing a hybrid OIP nanocrystal through an inverse nano-emulsion method according to an embodiment of the present invention.

Referring to FIG. 4A, the first solution having the hybrid OIP dissolved in the protic solvent is added in drops to the second solution having the alkyl halide surfactant dissolved in the aprotic solvent.

In this case, the protic solvent may include, but is not limited to, dimethylformamide, gamma butyrolactone, N-methylpyrrolidone, or dimethylsulfoxide.

In this case, the hybrid OIP may include a structure of $A_2BX_4$, $ABX_4$, $ABX_3$, or $A_{n-1}B_nX_{3n+1}$ (n is an integer ranging from 2 to 6). Here, A is an organic ammonium material, B is a metallic material, and X is a halogen element. For example, A may be $(CH_3NH_3)_n$, $((C_xH_{2x+1})_nNH_3)_2(CH_3NH_3)_n$, $(RNH_3)_2$, $(C_nH_{2n+1}NH_3)_2$, $(CF_3NH_3)$, $(CF_3NH_3)_n$, $((C_xF_{2x+1})_nNH_3)_2(CF_3NH_3)_n$, $((C_xF_{2x+1})_nNH_3)_2$, or $(C_nF_{2n+1}NH_3)_2$ (n is an integer greater than or equal to 1). Also, B may be a divalent transition metal, a rare earth metal, an alkaline earth metal, Pb, Sn, Ge, Ga, In, Al, Sb, Bi, Po, or a combination thereof. In this case, the divalent transition metal may be, for example, Ge, Sn, Pb, Eu, or Yb. Also, the alkaline earth metal may be, for example, Ca or Sr. Also, X may be Cl, Br, I, or a combination thereof.

A structure of the perovskite may be formed by combining AX and $BX_2$ at a certain ratio. For example, a first solution having an $A_2BX_3$ hybrid OIP dissolved therein may be prepared by dissolving AX and $BX_2$ in a protic solvent at a ratio of 2:1.

When A is $CH_3NH_3$ and X is Br as an example of a composition of AX, $CH_3NH_3Br$ may be obtained by dissolving $CH_3NH_2$ (methylamine) and HBr (hydroiodic acid) in a nitrogen atmosphere and evaporating a solvent.

Referring to FIG. 4B, when the first solution is added to the second solution, the hybrid OIP is precipitated from the second solution because of a solubility difference therebetween. An alkyl halide surfactant surrounds the hybrid OIP and stabilizes a surface of the hybrid OIP. Thus, the wavelength converting nanoparticle 20 containing a hybrid OIP nanocrystal containing a well-dispersed OIP-NC is generated. In this case, the surface of the hybrid OIP nanocrystal is surrounded by organic ligands, which are alkyl halides.

The wavelength converting nanoparticle containing the hybrid OIP nanocrystal may be obtained by applying heat to selectively evaporate a protic solvent containing the wavelength converting nanoparticle 20 containing the hybrid OIP nanocrystal, which is dispersed in an aprotic solvent having the alkyl halide surfactant dissolved therein, or by adding a co-solvent capable of being mixed with both of the protic solvent and the aprotic solvent to selectively extract the protic solvent containing the nanoparticle from the aprotic solvent.

The above-described wavelength converting nanoparticle may be dispersed in all organic solvents. Thus, the wavelength converting nanoparticle may be applied to various electronic devices because a size, a light-emitting wavelength spectrum, a ligand, and a constituent element thereof can be easily adjusted.

<Wavelength Converting Layer>

A nano wavelength converting layer including a hybrid OIP nanocrystal according to an embodiment of the present invention will be described below.

Figure 5:
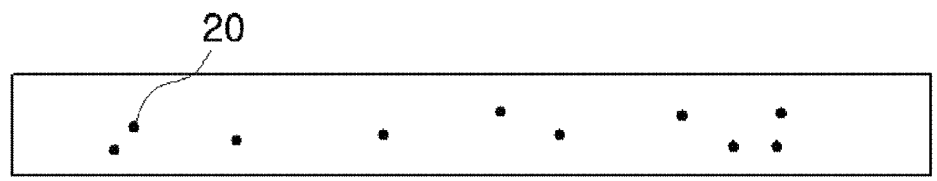
FIG. 5 shows a wavelength-converting layer according to an embodiment of the present invention.

FIG. 5 shows a wavelength converting layer according to an embodiment of the present invention.

Referring to FIG. 5, the wavelength converting layer according to an embodiment of the present invention is a layer that includes the wavelength converting nanoparticle 20 containing a hybrid OIP nanocrystal according to an embodiment of the present invention.

Since the wavelength converting particle has the same configuration and function as those described in the section <Wavelength converting particle>, reference will be made to the above description.

The above-described wavelength converting layer may be formed as a polymer resin in which a plurality of the wavelength converting nanoparticles 20 are uniformly dispersed. In this case, the polymer resin serves as a dispersion medium that disperses the wavelength converting nanoparticle 20. Any transparent medium that is not changed by light, does not reflect and absorb light, and does not affecting performance of the wavelength converting nanoparticle 20 may be used as the dispersion material.

As an example, it is preferable that the dispersion material be made of a material that has high light resistance or moisture resistance and is not changed in color or quality by excitation light or the like, such as an epoxy resin or silicone.

The above-described dispersion medium may be in a liquid state. When the above-described dispersion medium is in the liquid state, the wavelength converting nanoparticle 20 may be manufactured to be applied to various devices. Also, when the above-described dispersion medium is in the liquid state and the above-described wavelength converting particle contains a plurality of organic ligands surrounding the hybrid OIP nanocrystal, the wavelength converting particle may be applied to a device without separate ligand purification. Thus, it is possible to simplify a process thereof.

<Wavelength Converting Body>

A manufacturing method for a wavelength converting body according to an embodiment of the present invention will be described below.

First, a wavelength converting particle is prepared.

Since the wavelength converting particle has the same configuration and function as those described in the section <Wavelength converting particle>, reference will be made to the above description.

Subsequently, the above-described wavelength converting particle is dispersed in a dispersion medium.

The wavelength converting particle is dispersed in the above-described dispersion medium. The dispersion medium may be in the liquid state. When the dispersion medium is in the liquid state and the dispersion medium and the wavelength converting particle dispersed in the dispersion medium are sealed by a sealing member, which will be described below, the dispersion medium and the wavelength converting particle are not limited by a shape of the sealing member and may be applied to various devices. For example, the dispersion medium may be an epoxy resin or silicone. It is preferable that the dispersion medium be made of a material that does not change in color or quality from excitation light or the like because the wavelength converting particle receives excitation light and emits wavelength-converted light.

Subsequently, the wavelength converting particle and the dispersion medium are sealed with the sealing member.

FIGS. 6A to 6E are cross-sectional views illustrating a sealing method for a wavelength converting body according to an embodiment of the present invention.

Figure 6A:
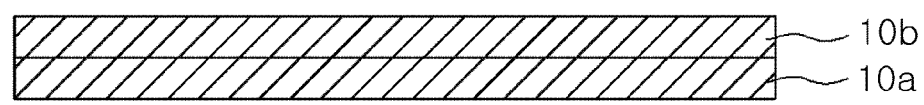
FIGS. 6A to 6E are cross-sectional views illustrating a sealing method for a wavelength converting body according to an embodiment of the present invention.

Referring to FIG. 6A, a first sealing member 10a and a second sealing member 10b are stacked.

A polymer or silicone that is not corroded by a dispersion medium 30 having the wavelength converting nanoparticle 20 dispersed therein may used as a sealing member. In particular, a polymer resin may be adhered to an object when it is heated, and thus a pack-type wavelength converting body into which the dispersion medium 30 having the wavelength converting nanoparticle 20 dispersed therein is injected may be formed by adhering sheet-type polymer resin to the dispersion medium 30 through a thermal adherence process.

Figure 6B:
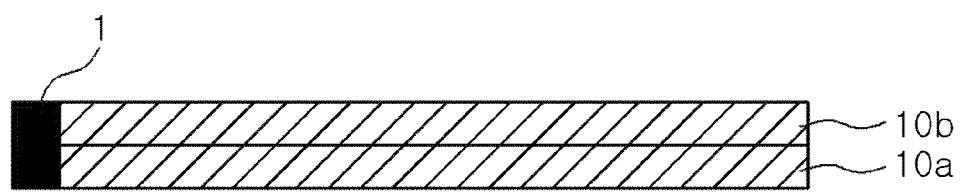

Referring to FIG. 6B, the first sealing member 10a and the second sealing member 10b may be adhered to each other through the thermal adherence process by heating the first sealing member 10a and the second sealing member 10b at one side 1 in order to prevent the above-described wavelength converting nanoparticle 20 and dispersion medium 30 from leaking through the first sealing member 10a and the second sealing member 10b. However, an adherence process other than the thermal adherence process may be used when the above-described wavelength converting nanoparticle 20 and dispersion medium 30 do not leak.

Figure 6C:
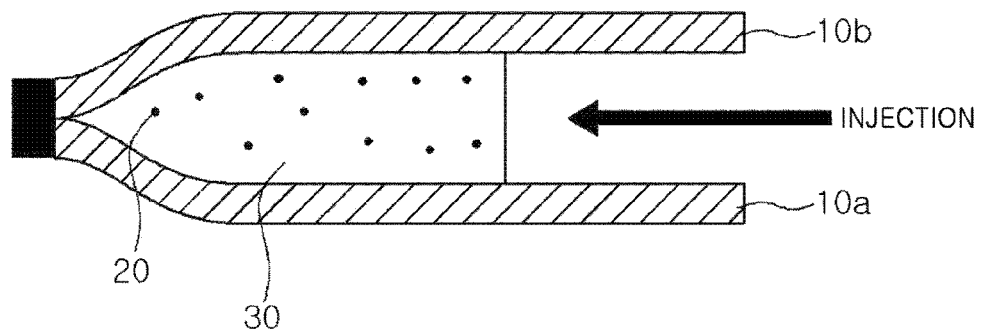

Referring to FIG. 6C, the dispersion medium 30 having the wavelength converting nanoparticle 20 dispersed therein is injected between the first sealing member 10a and the second sealing member 10b at the other side at which the sealing members are not adhered to each other.

Figure 6D:
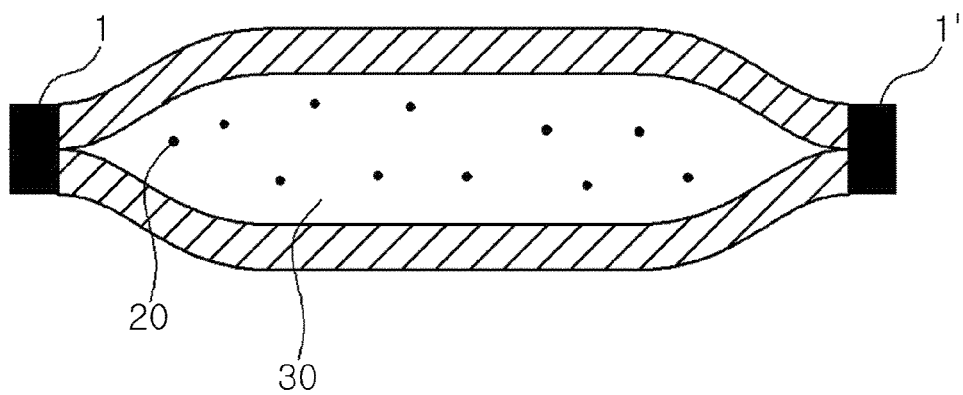

Referring to FIG. 6D, the dispersion medium 30 having the wavelength converting nanoparticle 20 dispersed therein is sealed with the first sealing members 10a and the second sealing member 10b by adhering the first sealing member 10a and the second sealing member 10b at the other side 1' through the thermal adherence process.

Figure 6E:
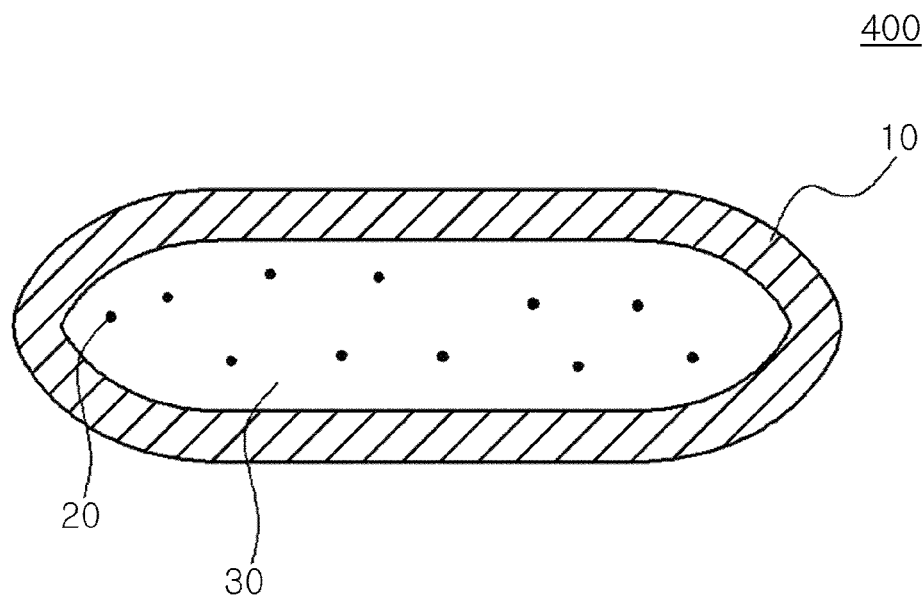

Referring to FIG. 6E, it can be seen that a hybrid OIP nano wavelength converting body 400 in which the dispersion medium 30 having the wavelength converting nanoparticle 20 dispersed therein is sealed with the sealing members 10 is formed. The above-described hybrid OIP nano wavelength converting body 400 may be advantageously applied to a light-emitting device without needing a separate ligand purification process by dispersing the wavelength converting nanoparticle 20 containing a hybrid OIP nanocrystal, which is a wavelength converting material, in the dispersion medium 30 and sealing the wavelength converting nanoparticle 20 dispersed in the dispersion medium 30. Accordingly, it is possible to prevent oxidation of the wavelength converting particle due to ligand purification and thus exhibit a high color purity and luminescent effect when the hybrid OIP nano wavelength converting body 400 is applied to a light-emitting device. It is also possible to simplify a process thereof.

<Light-Emitting Device>

Figure 7:
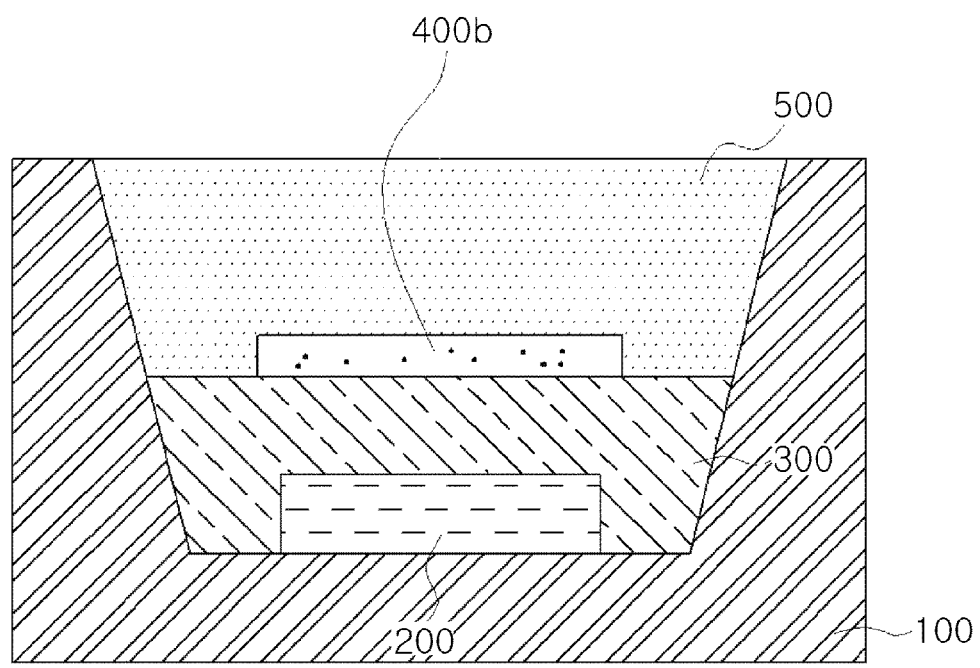
FIG. 7 is a cross-sectional view of a light-emitting diode (LED) according to an embodiment of the present invention.

FIG. 7 is a cross-sectional view of a light-emitting device according to an embodiment of the present invention.

Referring to FIG. 7, a light-emitting device according to an embodiment of the present invention includes a base structure 100, at least one excitation light source 200 disposed on the base structure 100 and configured to emit light of a predetermined wavelength, and a wavelength converting layer 400B disposed along an optical path of the at least one excitation light source 200 and containing the wavelength converting nanoparticle 20.

The base structure 100 may be a package frame or a base substrate. When the base structure 100 is a package frame, the package frame may include a base substrate. The base substrate may be a sub-mount substrate or a light-emitting diode (LED) wafer. The LED elements may be formed on a wafer before being separated into units of an LED chip. The base substrate may be a silicon substrate, a metal substrate, a ceramic substrate, or a resin substrate.

The base structure 100 may be a packet lead frame or a package pre-mold frame. The base structure 100 may include bonding pads (not shown). The bonding pads may contain Au, Ag, Cr, Ni, Cu, Zn, Ti, Pd, or the like. External connection terminals (not shown) connected to the bonding pads may be disposed at an outer surface of the base structure 100. The bonding pads and the external connection terminals may be included in a package lead frame.

The at least one excitation light source 200 is located on the base structure 100. It is preferable that the at least one excitation light source 200 emit light of a wavelength shorter than a light-emitting wavelength of a wavelength converting particle of the wavelength converting layer 400B. The at least one excitation light source 200 may be any one of an LED and a laser diode. Also, when the base structure 100 is an LED wafer, the positioning of the excitation light source may be omitted. For example, a blue LED may be used as the at least one excitation light source 200, and a gallium nitride-based LED that emits blue light of a wavelength ranging from 420 nm to 480 nm may be used as the blue LED.

Figure 8:
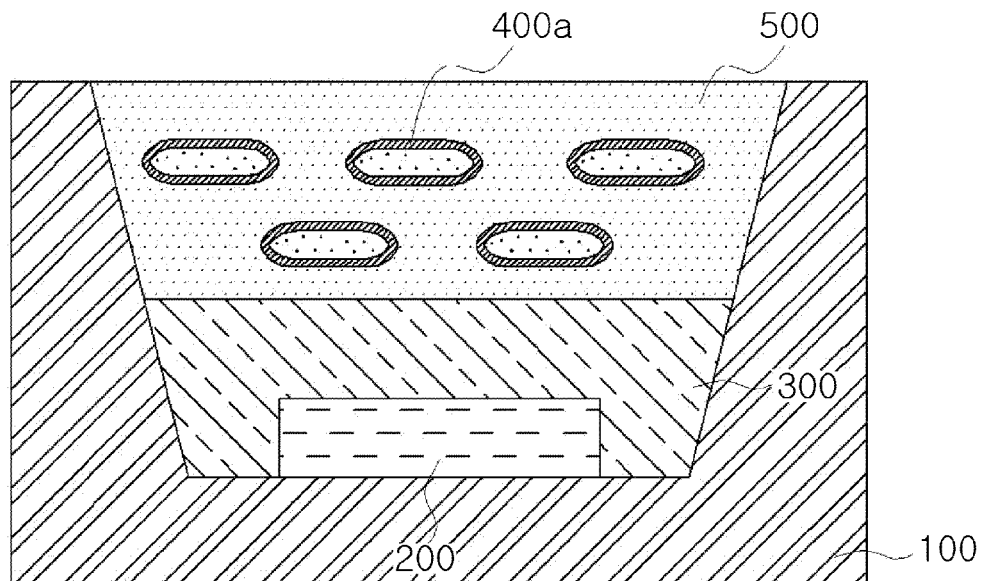
FIG. 8 shows an LED according to another embodiment of the present invention.

As shown in FIG. 8, a first encapsulation part 300 may be formed by pouring an encapsulation material for encapsulating the at least one excitation light source 200 over the at least one excitation light source 200. The first encapsulation part 300 may serve as a protective film and also serve to encapsulate the at least one excitation light source 200. Also, when the wavelength converting layer 400B is located over the first encapsulation part 300, a second encapsulation part 500 may be additionally formed to protect and fix the wavelength converting layer 400B. The encapsulation material may include at least one of an epoxy, a silicone, acrylic polymers, a glass, carbonate polymers, and mixtures thereof.

The first encapsulation part 300 may be formed using various methods such as a compression molding method, a transfer molding method, a dotting method, a blade coating method, a screen coating method, a dip coating method, a spin coating method, a spray method, or an inkjet printing method. However, the first encapsulation part 300 may be omitted.

Since the wavelength converting layer 400B has the same configuration and function as those described in the sections <Wavelength converting layer> and <Wavelength converting particle>, reference will be made to the above description.

As shown in FIG. 7, the second encapsulation part 500 may be formed by pouring an encapsulation material for encapsulating the wavelength converting layer 400B over the wavelength converting layer 400B. The second encapsulation part 500 may be formed using the same material as the first encapsulation part 300 through the same method as the first encapsulation part 300.

The light-emitting device may be applied to a lighting unit, a backlight unit, or the like as well as a device for emitting light.

FIG. 8 shows an LED according to another embodiment of the present invention.

Referring to FIG. 8, the hybrid OIP nano wavelength converting body 400 may include a wavelength converting body 400A, as shown in FIG. 6.

Since the wavelength converting body 400A has the same configuration and function as those described in the sections <Wavelength converting body> and <Wavelength converting particle>, reference will be made to the above description.

According to an embodiment of the present invention, the limit-emitting device has been shown as a unit cell. However, when the base structure is a sub-mount substrate or a LED wafer, multiple LED chips, each having a wavelength converting layer formed therein, may be located on the sub-mount substrate and the LED wafer, and the sub-mount substrate or the LED wafer may be cut and processed in units of a unit cell.

For a better understanding of the present invention, a preferred experimental example will be described below. However, the following experimental example is merely intended to facilitate an understanding of the present invention, and thus the present invention is not limited thereto.

MANUFACTURED EXAMPLE

Manufacture of Wavelength Converting Particle

A wavelength converting nanoparticle containing a hybrid OIP nanocrystal according to an embodiment of the present invention was formed. The wavelength converting nanoparticle was formed through an inverse nano-emulsion method.

In detail, a first solution was prepared by dissolving a hybrid OIP in a protic solvent. In this case, dimethylformamide was used as the protic solvent, and $(CH_3NH_3)_2PbBr_4$ was used as the hybrid OIP. In this case, $(CH_3NH_3)_2PbBr_4$ was formed by mixing $CH_3NH_3Br$ and $PbBr_2$ at a ratio of 2:1.

Subsequently, a second solution having an alkyl halide surfactant dissolved in an aprotic solvent was prepared. In this case, toluene was used as the aprotic solvent, and octadecylammonium bromide $(CH_3(CH_2)_{17}NH_3Br)$ was used as the alkyl halide surfactant.

Subsequently, a wavelength converting particle containing a hybrid OIP nanocrystal was formed by slowly adding the first solution to the second solution, which is being strongly agitated, in drops.

COMPARATIVE EXAMPLE 1

A thin-film type hybrid OIP (an OIP film) was manufactured.

In detail, a thin film of $(CH_3NH_3)_2PbBr_4$ was manufactured by dissolving $(CH_3NH_3)_2PbBr_4$ in dimethylformamide, which was a protic solvent, to manufacture a first solution and then performing spin-coating on a glass substrate with the first solution.

COMPARATIVE EXAMPLE 2

A thin-film type hybrid OIP (an OIP film) was manufactured.

In detail, a thin film of $(CH_3NH_3)_2PbCl_4$ was manufactured by dissolving $(CH_3NH_3)_2PbCl_4$ in dimethylformamide, which was a protic solvent, to manufacture a first solution and then performing spin-coating on a glass substrate with the first solution.

EXPERIMENTAL EXAMPLE

Figure 9:
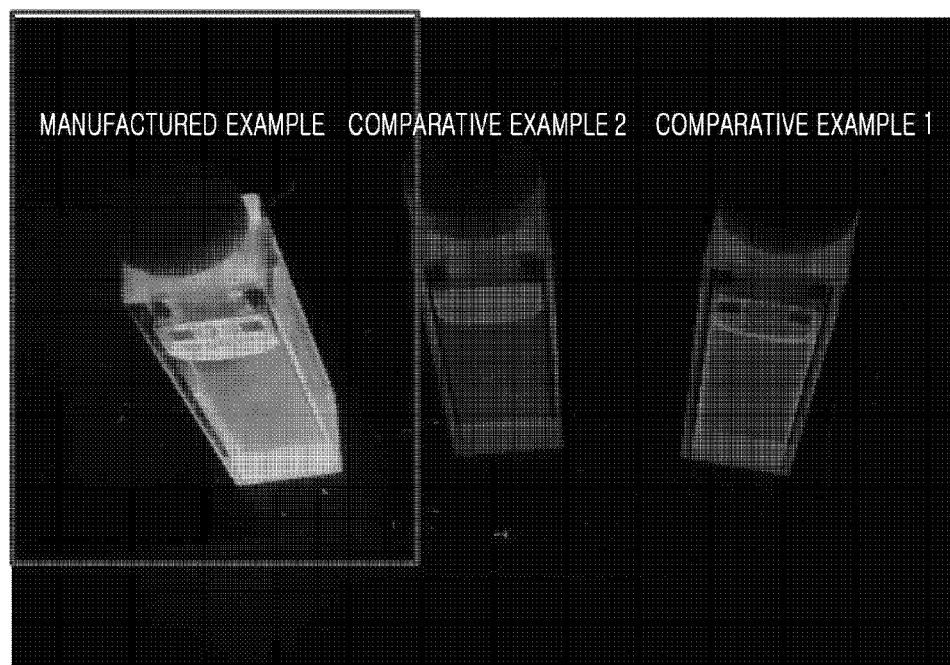
FIG. 9 shows a fluorescent image obtained by photographing light that is emitted when ultraviolet light is emitted to a wavelength converting material of a manufactured example and hybrid OIP films according to Comparative Example 1 and Comparative Example 2.

FIG. 9 shows a fluorescent image obtained by photographing light that is emitted when ultraviolet light is emitted to a wavelength converting material of the manufactured example and hybrid OIP films according to Comparative Example 1 and Comparative Example 2.

Referring to FIG. 9, it can be seen that the wavelength converting particle having the form of a nanoparticle according to the manufactured example emits very bright green light while the hybrid OIPs having the form of a thin film other than a nanoparticle emit dark light.

Also, it can be seen, as a result of measuring a photoluminescence quantum yield (PLQY), that the hybrid OIP particle according to the manufactured example exhibit very high values.

Conversely, the thin-film type hybrid OIPs according to Comparative Example 1 and Comparative Example 2 exhibit low PLQY values of about 1%.

Figure 10:
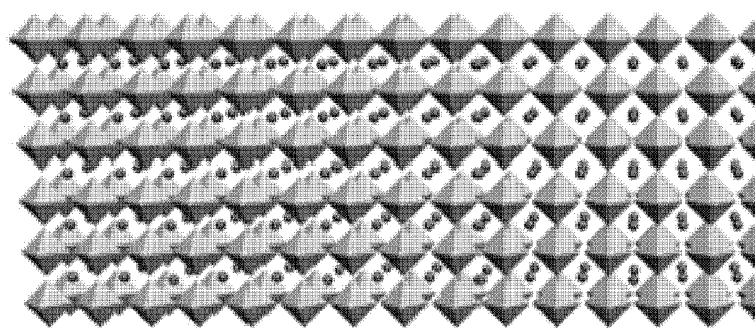
FIG. 10 is a schematic diagram of wavelength converting particles according to the manufactured example and Comparative Example 1.
Figure 10:
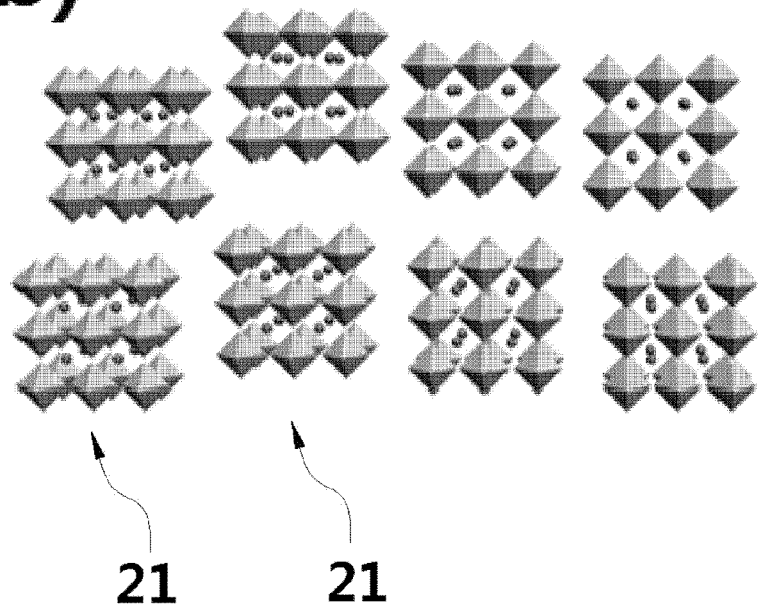

FIG. 10 is a schematic diagram of wavelength converting particles according to the manufactured example and Comparative Example 1.

FIG. 10A is a schematic diagram of the wavelength converting particles according to Comparative Example 1, and FIG. 10B is a schematic diagram of the wavelength converting particles according to the manufactured example. Referring to FIG. 10A, the wavelength converting particles according to Comparative Example 1 are in the form of a thin-film. Referring to FIG. 10B, the wavelength converting particles according to the manufactured example are in the form of a hybrid OIP nanocrystal 21.

Figure 11:
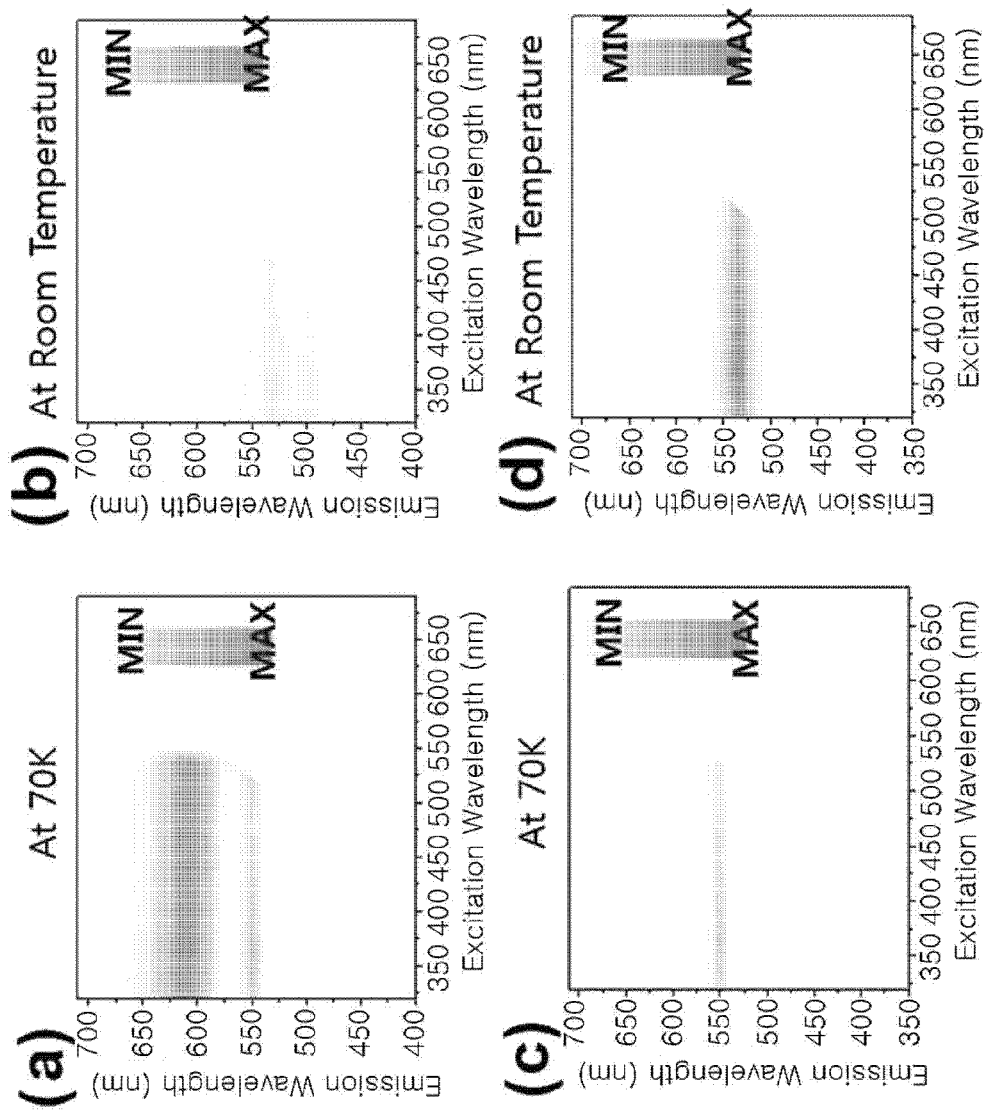
FIG. 11 shows images obtained by photographing photoluminescence matrices of the wavelength converting particles according to the manufactured example and Comparative Example 1 at normal temperature and low temperature.

FIG. 11 shows images obtained by photographing photoluminescence matrices of wavelength converting particles according to the manufactured example and Comparative Example 1 at normal temperature and low temperature.

FIG. 11A shows the image obtained by photographing the photoluminescence matrix of the thin-film type hybrid OIP (OIP film) according to Comparative Example 1 at low temperature (70K), and FIG. 11B shows the image obtained by photographing the photoluminescence matrix of the thin-film type hybrid OIP (OIP film) according to Comparative Example 1 at room temperature.

FIG. 11C shows the image obtained by photographing the photoluminescence matrix of the wavelength converting nanoparticle containing the hybrid OIP nanocrystal according to the manufactured example at low temperature (70K), and FIG. 11D shows the image obtained by photographing the photoluminescence matrix of the wavelength converting nanoparticle containing the hybrid OIP nanocrystal according to the manufactured example at room temperature.

Referring to FIGS. 11A to 11D, it can be seen that the wavelength converting nanoparticle containing the hybrid OIP nanocrystal according to the manufactured example exhibits higher color purity than the thin-film type hybrid OIP (OIP film) according to Comparative Example 1 while exhibiting photoluminescence at the same position. It can be also seen that the OIP-NC film according to the manufactured example exhibits photoluminescence with the same level of color purity at room temperature and low temperature and also does not decrease in luminescence intensity. Conversely, the thin-film type hybrid OIP according to Comparative Example 1 has different color purity levels and luminescence positions at room temperature and low temperature and also exhibits low luminescence intensity at room temperature because excitons thereof are separated as free charges and disappear, instead of being used to emit light, due to thermal ionization and charge carrier delocalization.

Figure 12:
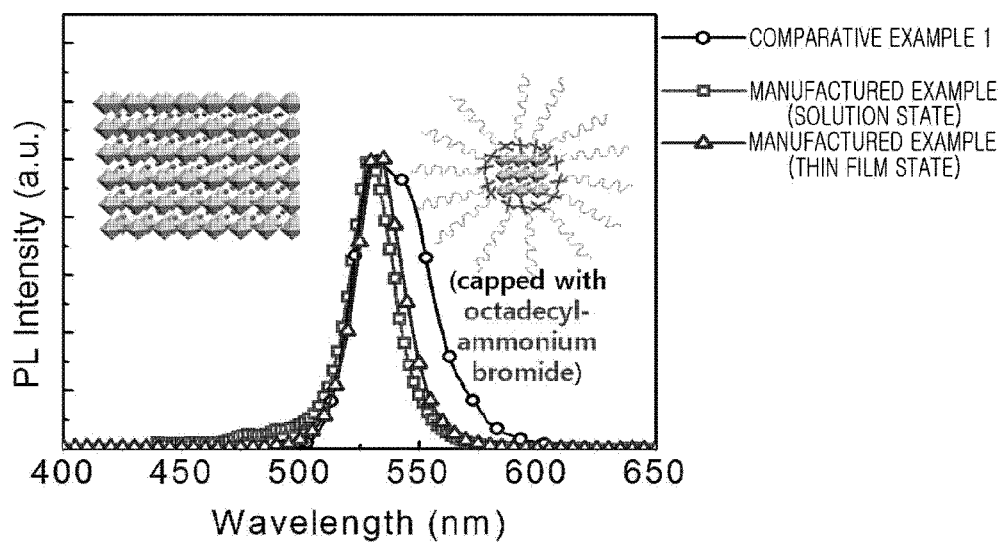
FIG. 12 shows a result graph obtained by photographing photoluminescence of the wavelength converting particles according to the manufactured example and Comparative Example 1.

FIG. 12 shows a result graph obtained by photographing photoluminescence of the wavelength converting particles according to the manufactured example and Comparative Example 1.

Referring to FIGS. 12, it can be seen that, when the hybrid OIP nanoparticle according to the manufactured example is located in a solution, that is, in the liquid state, the hybrid OIP nanoparticle exhibits higher color purity than the conventional hybrid OIP according to Comparative Example 1 while exhibiting photoluminescence at the same position.

The wavelength converting particle containing the nanocrystal including the OIP according to the present invention may have a hybrid OIP nanocrystal having a crystalline structure obtained by combining FCC and BCC formed therein, have a lamellar structure composed of alternating organic and inorganic surfaces, and exhibit a high color purity because excitons are bound to the inorganic surface.

In a nanocrystal having a size ranging from 10 nm to 300 nm, an exciton diffusion length may decrease and also exciton binding energy may increase. Thus, it is possible to prevent disappearance of excitons due to thermal ionization and charge carrier delocalization such that luminescent efficiency at room temperature is high.

Furthermore, by synthesize a nanocrystal having a three-dimensional structure unlike the OIP, it is possible to increase exciton binding energy to enhance luminescent efficiency while increasing durability and stability.

Also, according to the manufacturing method for a wavelength converting particle containing a hybrid OIP nanocrystal according to the present invention, it is possible to synthesize a wavelength converting nanoparticle containing a hybrid OIP nanocrystal adjusted in size depending on a length and size of an alkyl halide surfactant.

While the present invention has been particularly shown and described with reference to preferred embodiments thereof, the present invention is not limited to the embodiments, and various modifications and changes may be made therein by those skilled in the art without departing from the sprit and scope of the present invention.

<Description of reference numerals>

| | |
|---|---|
| 1: one side of sealing member | 1': other side of sealing member |
| 10: sealing member | 20: wavelength converting nanoparticle |
| 30: dispersion medium | 100: base structure |
| 200: excitation light source | 300: first sealing part |
| 400B: wavelength converting layer | 400A: wavelength converting body |
| 500: second sealing part | |

The invention claimed is:

1. A perovskite wavelength-converting layer, the layer comprising:
 a wavelength-converting particle comprising one or more nanocrystals of a perovskite material having a nanocrystal size greater than 10 nm and smaller than 300 nm that is configured to absorb light having a first wavelength and to emit light having a second wavelength, wherein the second wavelength of the light emitted from the perovskite material does not change substantially over the nanocrystal size thereof unlike a quantum dot that substantially changes a wavelength of light emitted therefrom over a nanocrystal size thereof; and
 wherein the perovskite material has a crystal structure of $A_2BX_4$, $ABX_4$, $ABX_3$, or $A_{n-1}B_nX_{3n+1}$ (n is an integer ranging from 2 to 6); and
 wherein A is organic ammonium or organic cation, B is a metal, and X is a halogen; and
 a plurality of ligands attached to the one or more nanocrystals and configured to make the one or more nanocrystals more dispersible than without such ligands in a medium;
 a dispersion medium configured to disperse the wavelength-converting nanoparticle; and
 wherein the wavelength-converting particle is dispersed in the dispersion medium.

2. The perovskite wavelength-converting layer of claim 1, wherein the second wavelength of the light emitted from the perovskite material does not change substantially over the nanocrystal size thereof.

3. The perovskite wavelength-converting layer of claim 1, wherein the dispersion medium is selected from a group consisting of at least one of a polymer, epoxy, and a silicone resin.

4. The perovskite wavelength-converting layer of claim 1, wherein the dispersion medium is not changed in color by excitation light.

5. The perovskite wavelength-converting layer of claim 1, wherein the dispersion medium comprises a transparent medium.

6. The perovskite wavelength-converting layer of claim 1, wherein
 A is $((CH_3NH_3)_n$, $((C_xH_{2x+1})_nNH_2)(CH_3NH_3)_n$, $(RNH_3)_2$, $(C_nH_{2n+1}NH^3)_2$, $(CF_3NH_3)$, $(CF_3NH_3)_n$, $((C_xF_{2x+1})_nNH_2)(CF_3NH_3)_n$, $((C_xF_{2x+1})_nNH_3)_2$, or $(C_nF_{2n+1}NH_3)_2$, wherein "n" is an integer greater than or equal to 1and "x" is an integer greater than or equal to 1;
 wherein B is a divalent transition metal, a rare earth metal, an alkaline earth metal, Pb, Sn, Ge, Ga, In, Al, Sb, Bi, Po, or a combination thereof;
 "R" is an Alkyl; and
 X is Cl, Br, I, or a combination thereof.

7. The perovskite wavelength-converting layer of claim 1, wherein the wavelength-converting particle is uniformly dispersed in the dispersion medium.

8. A perovskite wavelength-converting body comprising:
 a wavelength-converting particle comprising one or more nanocrystals of a perovskite material having a nanocrystal size greater than 10 nm and smaller than 300 nm that is configured to absorb light having a first wavelength and to emit light having a second wavelength, wherein the second wavelength of the light emitted from the perovskite material does not change substantially over the nanocrystal size thereof unlike a quantum dot that substantially changes a wavelength of light emitted therefrom over a nanocrystal size thereof; and
 wherein the perovskite material has a crystal structure of $A_2BX_4$, $ABX_4$, $ABX_3$, or $A_{n-1}B_nX_{3n+1}$ (n is an integer ranging from 2 to 6); and
 wherein A is organic ammonium or organic cation, B is a metal, and X is a halogen; and
 a plurality of ligands attached to the one or more nanocrystals and configured to make the one or more nanocrystals more dispersible than without such ligands in a medium;
 a dispersion medium configured to disperse the wavelength-converting nanoparticle; and
 a sealing member that seals the wavelength-converting particle and the dispersion medium,
 wherein the wavelength-converting particle is dispersed in the dispersion medium.

9. The perovskite wavelength-converting body of claim 8, wherein the dispersion medium is in a liquid state.

* * * * *